United States Patent
Sasaki

(10) Patent No.: US 7,234,185 B2
(45) Date of Patent: Jun. 26, 2007

(54) APPARATUS FOR REMOVING PARTICLES

(75) Inventor: Hiroshi Sasaki, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 661 days.

(21) Appl. No.: 10/621,441

(22) Filed: Jul. 18, 2003

(65) Prior Publication Data
US 2004/0016443 A1  Jan. 29, 2004

(30) Foreign Application Priority Data
Jul. 18, 2002  (JP) .................... 2002-209797

(51) Int. Cl.
*A47L 13/40* (2006.01)
*B08B 6/00* (2006.01)

(52) U.S. Cl. ........................ 15/1.51; 134/902
(58) Field of Classification Search ............. 15/1.51; 134/902
See application file for complete search history.

(56) References Cited

U.S. PATENT DOCUMENTS

| | | | |
|---|---|---|---|
| 3,536,528 A | 10/1970 | De Gest | |
| 5,516,369 A * | 5/1996 | Lur et al. | ............ 134/1.3 |
| 6,451,176 B1 | 9/2002 | Vernon et al. | |
| 6,523,210 B1 * | 2/2003 | Andros | ............ 15/102 |

FOREIGN PATENT DOCUMENTS

| | | |
|---|---|---|
| EP | 0 453 780 A2 | 10/1991 |
| EP | 0 790 642 A2 | 8/1997 |
| JP | 6-25066 | 9/1994 |
| JP | 7-161598 | 6/1995 |

OTHER PUBLICATIONS

Patent Abstracts of Japan, vol. 0144, No. 67 (E-0989), Oct. 11, 1990 & JP 02 192110 A (Fujitsu Ltd), Jul. 27, 1990.
Patent Abstracts of Japan, vol. 0112, No. 51 (C-440), Aug. 14, 1987 & JP 62 056568 A (Mitsubishi Electric Corp), Mar. 12, 1987.
Patent Abstracts of Japan, vol. 2003, No. 12, Dec. 5, 2003 & JP 2003 309156 A (Ulvac Japan Ltd), Oct. 31, 2003.

* cited by examiner

*Primary Examiner*—Randall Chin
(74) *Attorney, Agent, or Firm*—Nixon & Vanderhye, P.C.

(57) ABSTRACT

The apparatus for removing particles in accordance with the present invention is for a processing device including a vacuum container unit having a plurality of chambers in which a predetermined process is performed on a wafer carried in by a conveyer unit in atmosphere. The apparatus comprises a charge neutralizing means for neutralizing charges generated on a surface of the wafer, the charge neutralizing means being mounted in a waiting-accommodation unit which constitutes a part of the conveyer unit, and a charging means for adsorbing particles in the vacuum container unit by electrostatic force, the charging means being mounted in the vacuum container unit.

5 Claims, 8 Drawing Sheets

PARTICLE COLLECTION PROCESSING

Normally, to adsorb particles in a vacuum container unit by electrostatic force by means of a charging means To prevent the adherence of particles to a surface of a device wafer

APPARATUS FOR REMOVING PARTICLES

BACKGROUND OF THE INVENTION

1. Field of the Invention

The present invention generally relates to an apparatus for removing particles, and more specifically, to an apparatus for removing particles for a processing device including a vacuum container unit in which a predetermined process is performed on a wafer carried in by a conveyer unit. As the processing device to which the present invention is applied, there is a sputtering apparatus for manufacturing electronic devices such as a semiconductor integrated circuit and a liquid crystal panel.

2. Description of the Prior Art

As electronic devices such as a semiconductor integrated circuit and a liquid crystal display panel become larger in size and the processing technique thereof becomes more microscopic, particles such as dust in atmosphere and fine grains in the liquid chemical during the manufacturing process influence the characteristics or yield of electronic devices significantly. Due to this, elimination of particles is a very important factor. For example, in the semiconductor integrated circuit, the distance between metal wires formed on the circuit requires design rule of about 0.2 μm to 0.1 μm and the processing technique to be more microscopic. In such a microscopic circuit, since the sizes of particles are as large as or larger than the distance between metal wires, yield (ratio of source material to product) is degraded when particles are adhered to the wafer causing short circuits.

For example, in a sputtering apparatus used in the manufacturing process of semiconductor integrated circuits, inert gas ions are generated in a vacuum container of high vacuum level and impacted on a target using electric field generated by applying voltage between the target and a wafer. Atoms broken out of the target material by the impacts are deposited on the wafer to form predetermined thin films. During the formation of the thin films, some of the atoms broken out of the target material by the impact are deposited not only on the wafer but also on a jig for fixing the wafer or around the jig. The target materials deposited on the portions other than the wafer are separated by the stress of the film as the deposition grows, to float in the vacuum container as particles. Moreover, abrasions of the conveyer unit for the wafer mounted in the vacuum container and other movable parts cause the generation of particles. Particles adhered on the wafer itself and carried into the vacuum container also exist.

As shown in FIG. 7, a film-forming device in which particles are removed using electrostatic force is disclosed in Japanese Patent Unexamined Publication JP-A 6-252066 (1994). The film-forming device includes a vacuum container 41, a plate support 42 mounted in the vacuum container, a particle-collecting plate 43, a charging means 44 for charging the particle-collecting plate 43, and a charging bar 45 which constitutes a portion of the charging means. The film-forming device also includes an exhaust port 46, a reaction gas introduction line 47, a cleaning gas introduction line 48, a valve 49 and others (not shown).

In accordance with the film-forming device, the particle-collecting plate 43 composed of electric conductor material is conveyed into the vacuum container 41 and disposed on a predetermined position of the plate support 42. The charging bar 45 which constitutes a part of the charging means 44 is then unfolded to contact and charge the particle-collecting plate 43. At the same time, gas is introduced into the vacuum container 41 through the cleaning gas introduction line 48 which joins the reaction gas introduction line 47, so that the particles blown off by the gas is adsorbed on the charged particle-collecting plate 43 by electrostatic force. The particle-collecting plate 43 to which particles had adsorbed is then conveyed out of the vacuum container 41. The particles in the device are eliminated in above-described manner. Wafers for forming devices are then conveyed into the vacuum container 41 to be subjected to film formation processes.

However, in the film-forming device disclosed in Japanese Patent Unexamined Publication JP-A 6-252066 (1994), gas is injected to blow off particles, which diffuses particles into the entire vacuum container. Since the area of the charged particle-collecting plate is smaller compared to that of inner wall of the vacuum container, the elimination of the entire diffused particles using only the particle-collecting plate is not enough. Moreover, since the charging electrode contacts the particle-collecting plate for charging, the surface of the particle-collecting plate may be damaged due to scratches, resulting in generation of additional particles.

In addition, since a mechanism for moving the charging bar is mounted through the wall of the vacuum container, the means for charging the particle-collecting plate is complex and large, and requires high installation costs. Moreover, the operating costs get higher since expensive gas for assisting combustion is used for dry cleaning.

In addition, since the film-forming process must be stopped for a long time while the particle-collecting plate adsorbs particles, the rate of operation is reduced.

BRIEF SUMMARY

Therefore, it is an object of the present technology to provide an apparatus for removing particles which effectively eliminates particles in the vacuum container unit without degrading the rate of operation of the processing device, and is simple and inexpensive to embody.

In order to achieve the above-described object, there is provided an apparatus for removing particles for a processing device including a vacuum container unit having a plurality of chambers in which a predetermined process is performed on a wafer carried in by a conveyer unit in atmosphere. The apparatus comprises a charge neutralizing means for neutralizing charges generated on the surface of the wafer, the charge neutralizing means being mounted in a waiting-accommodation unit which constitutes a part of the conveyer unit, and a charging means for adsorbing particles in the vacuum container unit by electrostatic force, the charging means being mounted in the vacuum container unit.

In accordance with the apparatus, charges generated on the wafer surface is neutralized by the charge neutralizing means in the waiting-accommodation unit which constitute a part of the conveyer unit. Therefore, when the wafers are conveyed into the vacuum container unit, adherence of particles existing in the vacuum container unit to the wafer surface by electrostatic force is effectively prevented. In addition, in the vacuum container unit, the particles existing in the vacuum container unit are adsorbed to the charging means by electrostatic force to effectively remove the particles floating in the vacuum container unit. Moreover, the neutralization of the wafer surface by the charge neutralizing means and adsorption of particles by the charging means are performed without contacting the wafers. This prevents the generation of any additional particles on the wafer surface. As a result, the number of particles floating in the vacuum container unit is maintained at low level. Therefore, the yield (ratio of source material to product) of the product using the wafer is also improved than a conventional art.

In the apparatus for removing particles, the charge neutralizing means is mounted in the waiting-accommodation unit which constitutes a part of conveyer unit, i.e. under atmospheric pressure. On the other hand, since the charging means adsorbs the particle in the vacuum container unit by electrostatic force, the charging means can be embodied using a charged metal plate, for example, and does not require any movable parts. Therefore, the apparatus for removing particles can be embodied simply and inexpensively. As a result, the installation costs are low. Moreover, the apparatus for removing particles does not consume materials such as cleaning gas for removing particles, resulting in less operating costs compared to a conventional apparatus.

In addition, the neutralization of the wafer surface by the charge neutralizing means and adsorption of particles by the charging means can be performed while performing the inherent process of the processing device. Namely, the wafers are conveyed through the conveyer unit and the neutralization of the wafer surface and adsorption of particles can be performed while predetermined process is performed on the wafers conveyed through the conveyer unit in the vacuum container unit. Therefore, inherent process of the processing device does not need to be stopped for removing particles. As a result, the rate of operation of the processing device does not degraded.

In an embodiment of the apparatus for removing particles, the charge neutralizing means performs neutralization of charges generated on the wafer surface by discharging from electrodes mounted apart from the wafer.

In accordance with the apparatus for removing particles of this embodiment, the neutralization of the charges generated on the wafer surface by the charge neutralizing means is performed without contacting the wafer. Therefore, any additional particles are not generated from the wafer surface. In addition, the amount of charges (the amount of plus ions or minus ions) discharged from the electrodes can be adjusted to neutralize charges on the wafer surface properly.

In an embodiment of the apparatus for removing particles, the charging means includes a metal plate mounted apart from the wafer which is conveyed in the vacuum container unit, and adsorbs the particles by charging the metal plate.

In accordance with the apparatus for removing particles of this embodiment, the adsorption of the particles by the charging means is performed without contacting the wafer. Therefore, any additional particles are not generated from the wafer surface. In addition, the polarity (plus or minus) or amount of charges of the metal plate is adjusted properly to adsorb the particles in the vacuum container unit effectively.

In addition, there is provided a preferred method of removing particles for a processing device including a vacuum container unit having plurality of chambers in which a predetermined process is performed on a wafer carried in by a conveyer unit in atmosphere. The method comprises the steps of neutralizing charges generated on the surface of the wafer in a waiting-accommodation unit which constitutes a part of the conveyer unit, and adsorbing particles existing in the vacuum container unit by electrostatic force.

DETAILED DESCRIPTION OF THE PREFERRED EMBODIMENTS

An apparatus for removing particles in accordance with the present invention will be described in detail referring to the accompanying drawings.

Figure 1:
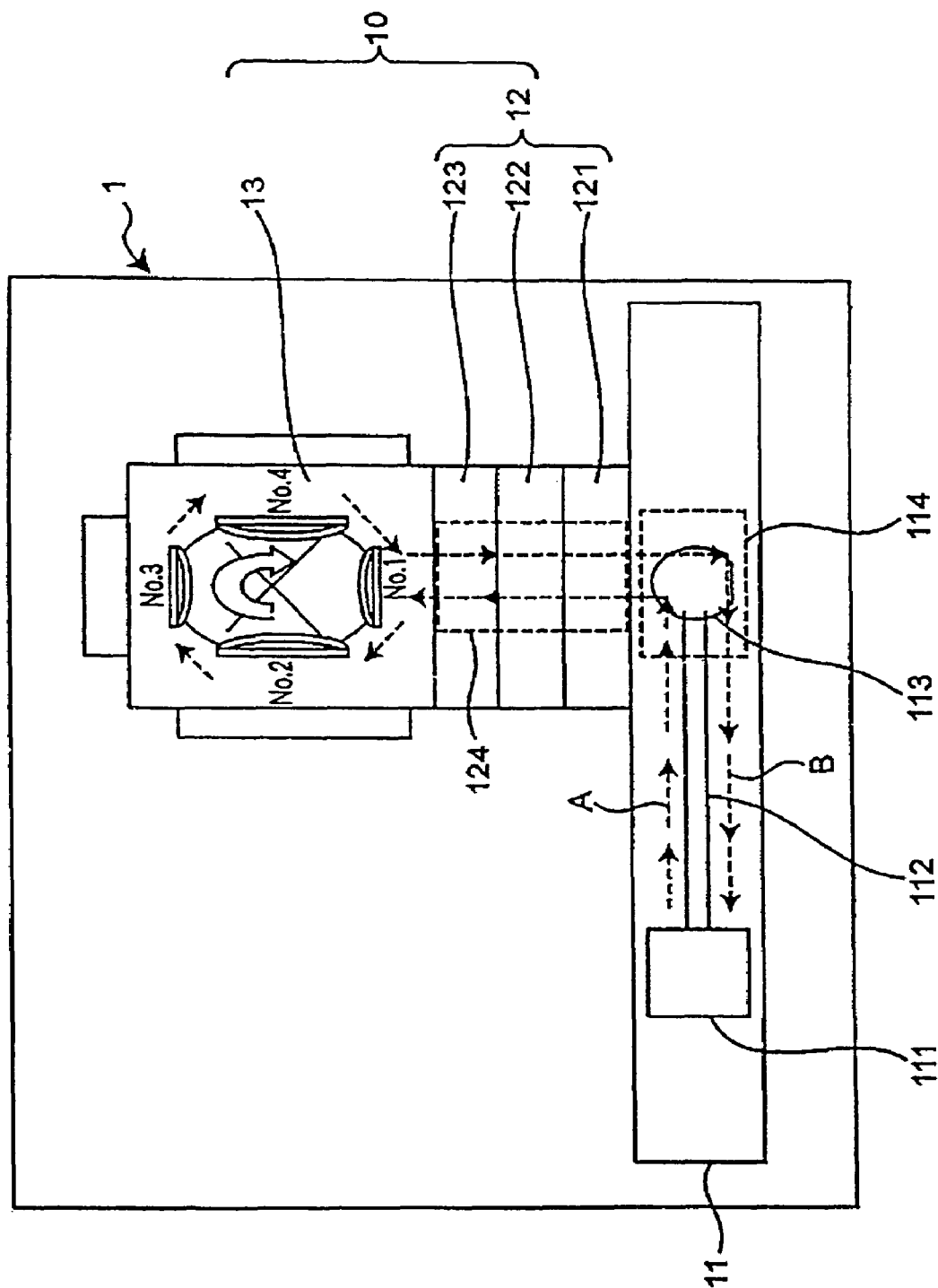
FIG. 1 is a plan view schematically illustrating the constitution of a sputtering apparatus including an apparatus for removing particles.

FIG. 1 is a plan view schematically illustrating the constitution of an example embodiment of a sputtering apparatus including an example apparatus for removing particles.

The sputtering apparatus 1 comprises a conveyer unit 11 for conveying wafer, a pressure buffer unit 12 and a process chamber 13. The pressure buffer unit 12 and the process chamber 13 constitute a vacuum container unit 10. The sputtering apparatus 1 also comprises a control unit for performing controls of the entire apparatus, a vacuum exhaust system, power supply unit, and other components, though not shown in the drawings, for they are not directly related to the present invention.

The conveyer unit 11 conveys a wafer for film formation to the vacuum container unit 10 along arrow A shown in dotted line. The conveyer unit 11 conveys the wafer out of the vacuum container unit 10 after the film formations along arrow B shown in dotted line. Specifically, as shown in FIG. 1 from left to right, the conveyer unit 11 comprises a cassette-loading unit 111 on which a cassette including a wafer (device wafer) mounted therein is disposed, a conveyer belt unit 112 which conveys the wafer along the direction of arrow A or arrow B, and a waiting-accommodation unit 113 in which the wafer is temporarily accommodated prior to being conveyed to the vacuum container unit 10. An ionizer 114 which serves as a charge neutralizing means for neutralizing electric charges on the wafer surface is mounted above the waiting-accommodation unit 113. The components of the conveyer unit 11 are all under atmospheric pressure. The ionizer 114 will be described in detail afterward.

The pressure buffer unit 12 is disposed between the conveyer unit 11 (waiting-accommodation unit 113) under atmospheric pressure and the process chamber 13 under vacuum. The pressure buffer unit 12 comprises a load lock chamber (LOC) 121, a buffer chamber (BUC) 122 and a cleaning chamber (CLC) 123 sequentially arranged through gates (not shown). Charging means 124 for removing particles are mounted in each of the chambers 121, 122, 123 which constitute the pressure buffer unit 12. The charging means 124 will be described in detail afterward.

The load lock chamber 121 loads the wafer by opening the gate (not shown) mounted at the border with waiting-accommodation unit 113 and increases the degree of vacuum with the wafer loaded therein using vacuum exhaust system (not shown). In this manner, the wafer can be loaded in the vacuum container unit 10 with high vacuum being maintained in the process chamber 13. The buffer chamber 122 accommodates wafers until the number of wafers in the buffer chamber 122 reaches a predetermined number that can be processed in one batch in the process chamber 13. The cleaning chamber 123 has etching function, in which the surface of the wafer is etched for cleaning prior to film formation process.

The process chamber 13 houses four wafer holders (No. 1–No. 4) disposed at four positions in this embodiment. The wafer disposed in the process chamber 13 is subjected to sputtering processes for formations of films while being moved from wafer holder No. 1 to No. 4. The wafer after the film formation processes is conveyed to the pressure buffer unit 12.

Figure 2:
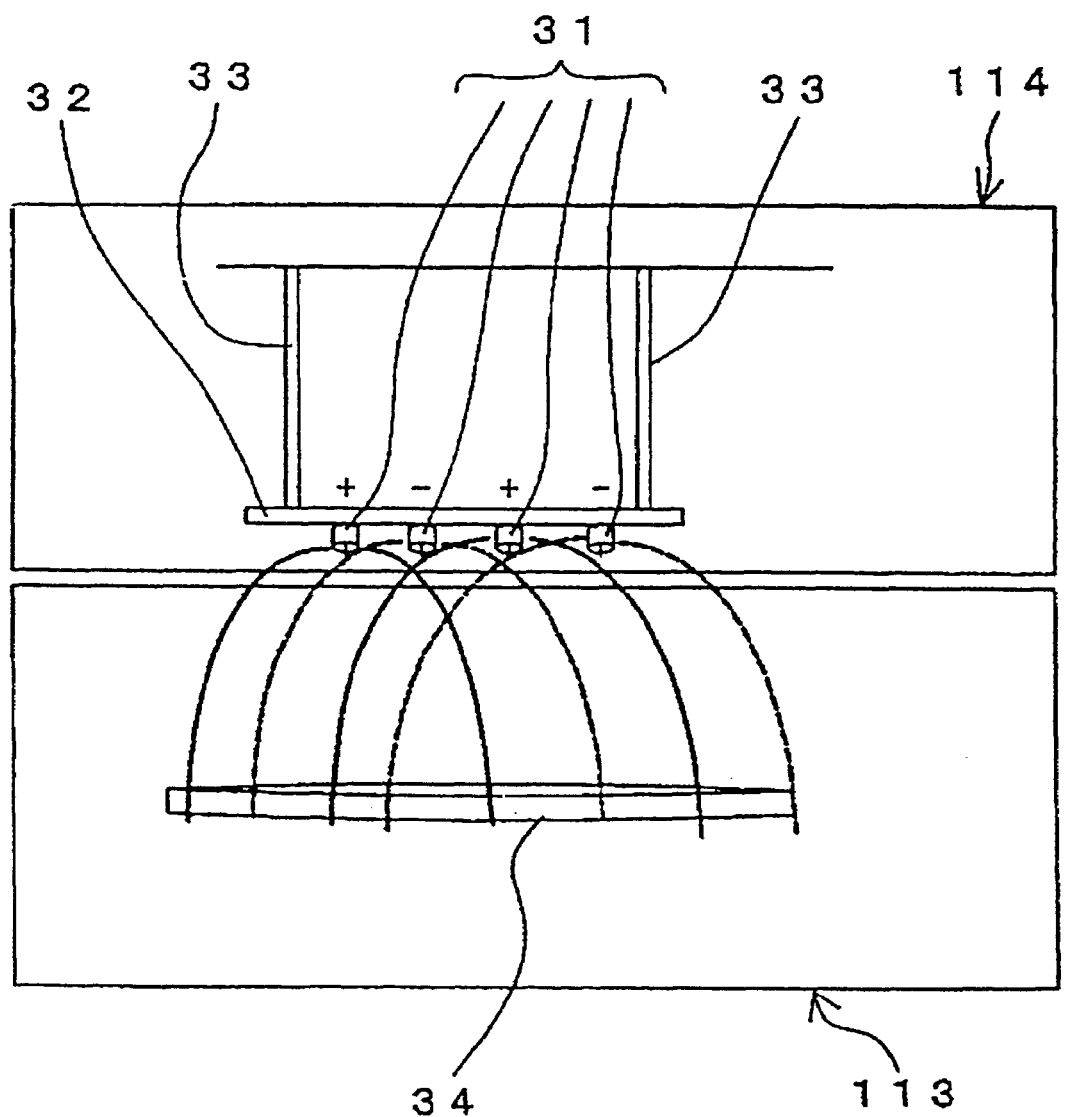
FIG. 2 is a lateral view schematically illustrating the constitution of an ionizer and a waiting-accommodation unit included in the sputtering apparatus.

FIG. 2 is a lateral view schematically illustrating the constitution of the ionizer 114 of FIG. 1 and a waiting-accommodation unit 113 included in the sputtering apparatus. The ionizer 114 comprises a plurality of ion generating electrodes 31 for generating ions, a horizontally extending ionizer bar (bar-shaped electrode) 32 to which the ion generating electrodes 31 are attached, and a support bar 33 which attaches the ionizer bar 32 to ionizer housing (not shown in detail). Each of the ion generating electrodes 31 faces the wafer disposed in the waiting-accommodation unit 113 with predetermined distance therebetween. The ionizer 114 also includes a non-contact type charge-measuring device (not shown) which is generally referred to as a static electricity checker. The amount of electric charges on the wafer surface can be measured without any contact using the non-contact type charge-measuring device. An ion dose to be irradiated is determined based on the amount of charges measured. Ions generated by the each of ion generating electrodes 31 are irradiated on the entire surface of the wafer 34. The charges on the surface of the wafer are thereby neutralized, i.e. are eliminated without contacting the wafer 34.

Referring to FIG. 2, the inonizer 114 has a plurality of (+), (−) electrodes. Each electrode repeats corona discharge so that (+) electrode generates (+) charge and (−) electrode generates (−) charge. Accordingly, charges on the surface of the wafer under the inonizer 114 are cancelled by the (+) (−) charges generated by the electrodes to be neutralized. Also, the inonizer 114 has a function that adjusts the (+) (−) charges in response to a state of charges on the wafer surface.

The plurality of the ion generating electrodes 31 is illustrated as to be generating plus and minus ions alternately in FIG. 2. However, this is merely an example of constitution of the ionizer, and the method of generating ions is not limited to this example. The amounts of plus and minus ions generated from each of the ion generating electrodes 31 can be adjusted properly to neutralize the charges on the wafer surface.

Figure 3:
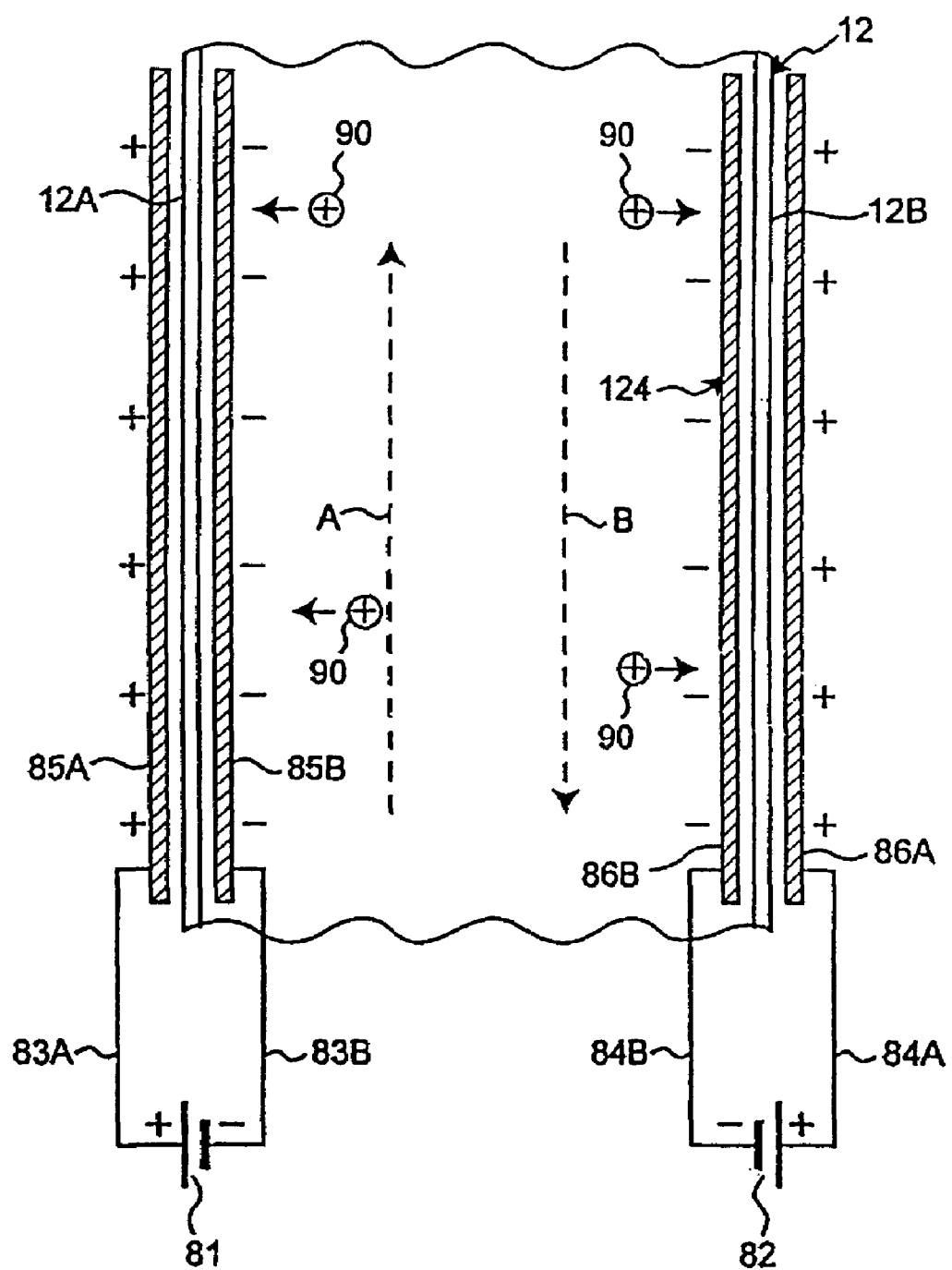
FIG. 3 is a plan view schematically illustrating a charging means mounted in a pressure buffer unit of the sputtering apparatus.

FIG. 3 is a plan view schematically illustrating a charging means 124 mounted in the pressure buffer unit 12 of FIG. 1. The pressure buffer unit 12 includes side walls 12A and 12B composed of an insulator (for example, quartz glass) which constitute the chambers 121, 122 and 123. The exteriors of the sidewalls 12A and 12B are under atmospheric pressure and the interiors thereof are under vacuum.

The charging means 124 includes internal plate electrodes 85B and 86B composed of metal plates mounted along the inner side of chamber side walls 12A and 12B, external plate electrodes 85A and 86A composed of metal plates mounted along the outer side of chamber side walls 12A and 12B to be opposed to the internal plate electrodes 85B and 86B, DC (Direct Current) power supplies 81 and 82, wirings 83A and 84A connecting plus terminals of power supplies 81 and 82 with the external plate electrodes 85A and 86A, respectively, and wirings 83B and 84B connecting minus terminals of the power supplies 81 and 82 with the internal plate electrodes 85B and 86B, respectively. The wirings 83B and 84B are mounted by airtightly penetrating the chamber wall.

The charging means shown in FIG. 3 is a capacitor of which external plate electrodes 85A and 86A are (+) charged and internal plate electrodes 85B and 86B are (−) charged via the chamber side walls therebetween, respectively. Accordingly, (+) charged particles within the chamber are collected on the (−) charged internal plate electrodes.

Capacitance exists between the internal plate electrodes 85B, 86B and the external plate electrodes 85A, 86A. Therefore, once a DC voltage is applied between the internal plate electrodes 85B, 86B and the external plate electrodes 85A, 85B, the amount of charge (charges) of the internal plate electrodes 85B, 86B are maintained unless disappeared by discharge. Accordingly, the charging means 124 does not require high power for operation.

Figure 4:
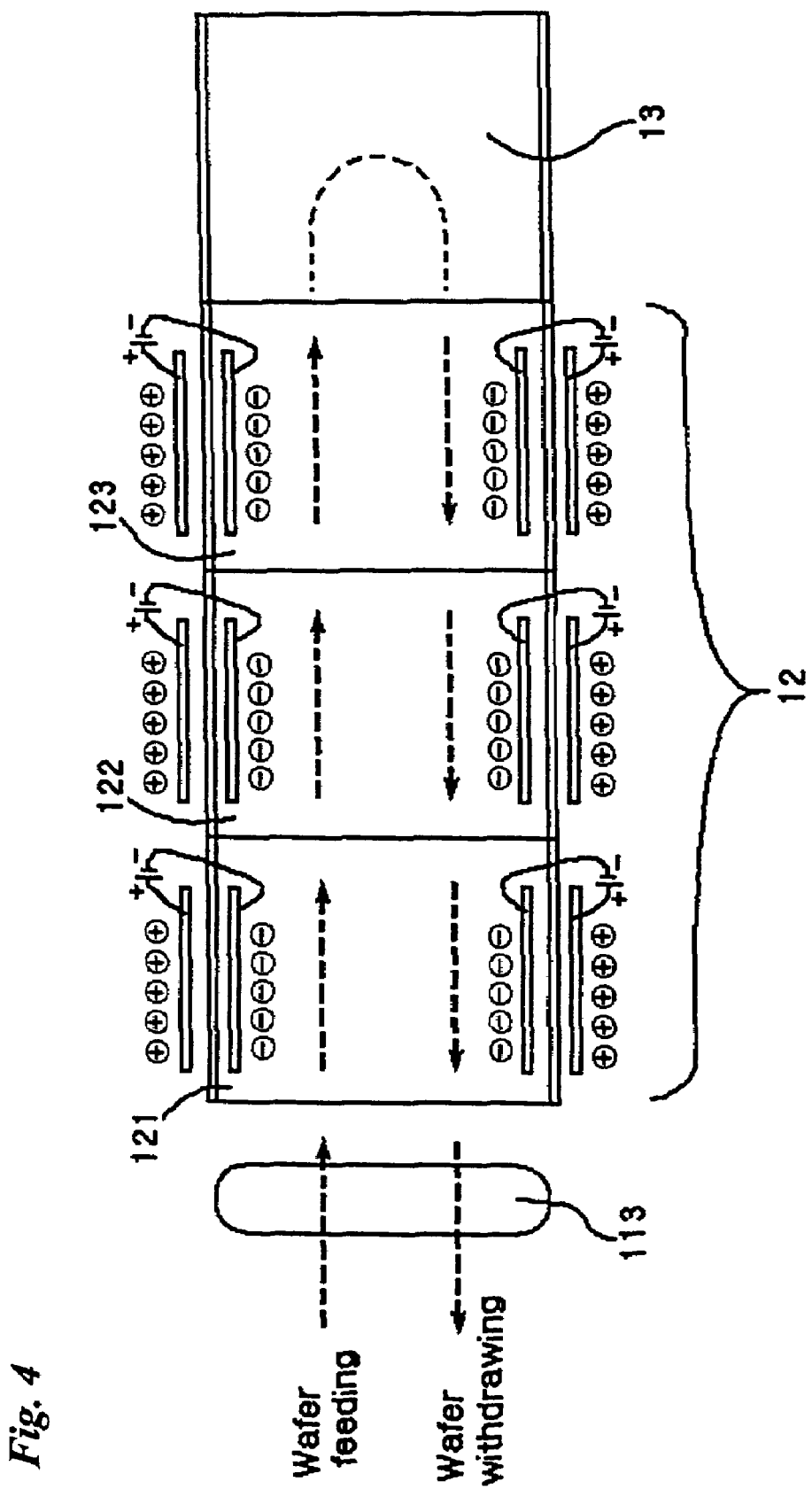
FIG. 4 is a plan view illustrating the structural relationship between charging means and each chamber.

In accordance with the embodiment, the load lock chamber 121, the buffer chamber 122 and the cleaning chamber 123 constituting the pressure buffer unit 12 include the charging means 124, respectively. However, the charging means 124 may be installed in at least one of chambers 121, 122 and 123. The structural relationship between the charging means 124 and each chamber 121, 122, 123 is shown in FIG. 4.

As described above, the ionizer 114 is mounted in the waiting-accommodation unit 113, i.e. under atmospheric pressure. On the other hand, the charging means 124 does not require movable parts. Therefore, the apparatus for removing particles including these components can be embodied simply and inexpensively. As a result, the installation costs are low. In addition, the use of materials such as cleaning gas is not required, which reduces the operation costs compared to that of a conventional apparatus.

Figure 5A:
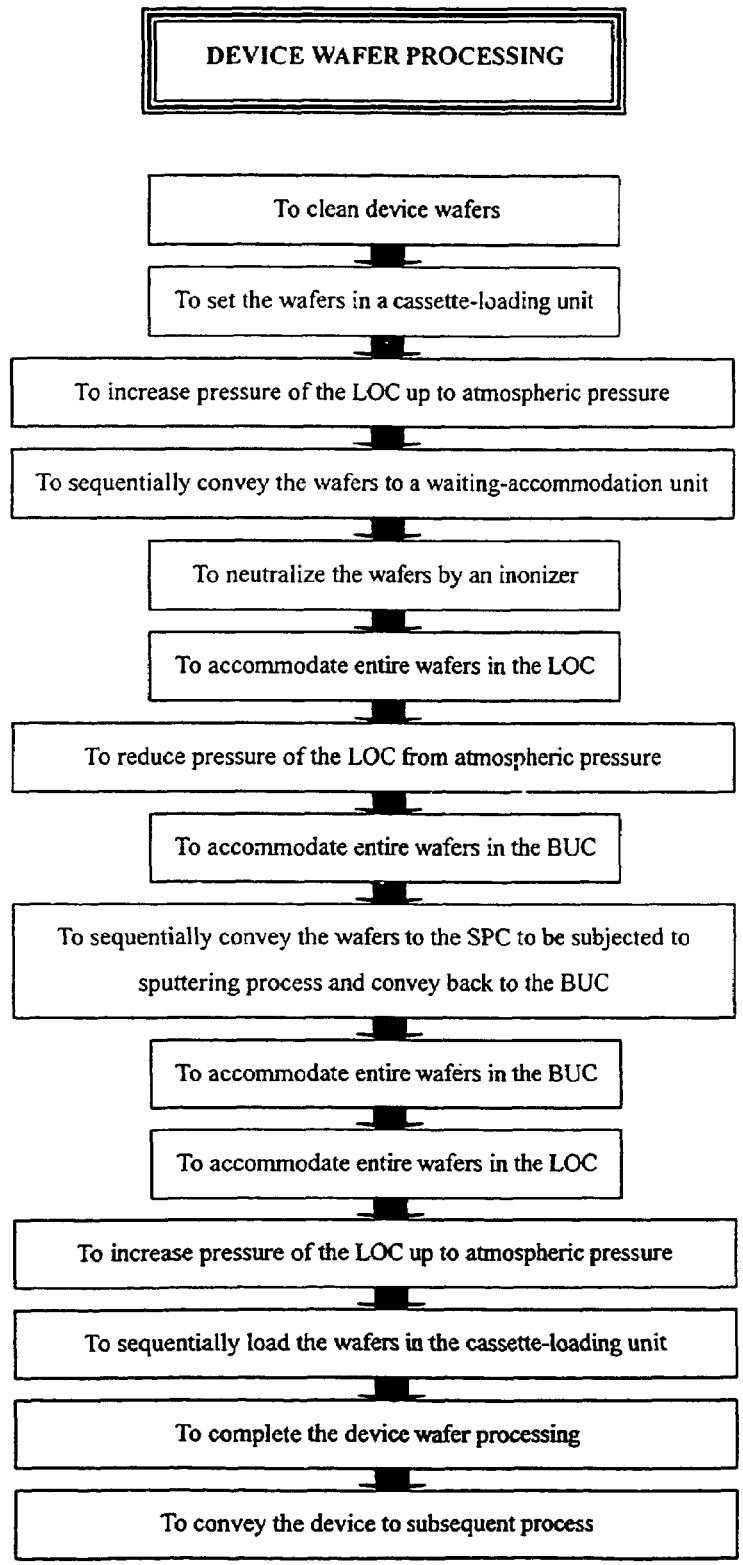
FIG. 5(A) is a diagram illustrating a flow of device wafer processing.
Figure 5B:
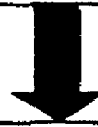
FIG. 5(B) is a diagram illustrating a flow of particle collection processing by the sputtering apparatus.

Flow charts illustrating a device wafer processing and a particle collection processing in the sputtering apparatus are shown in FIGS. 5(A) and 5(B), respectively.

(a) First, the flow chart illustrating a device wafer processing shown in FIG. 5(A) will be described referring to FIG. 1. In this embodiment, as an example, a silicon wafer having a diameter of 8 inches (about 200 millimeters) is used as a device wafer to manufacture semiconductor integrated circuits. Wafers of a predetermined number, 25 wafers for example, are cleaned and then loaded in a wafer cassette. The wafer cassette is set in the cassette-loading unit 111 of the sputtering apparatus. When a process start command is cued, the pressure in the load lock chamber (LOC) 121 of the pressure buffer unit 12, which is under vacuum, is increased up to atmospheric pressure. During the increase of the pressure, the wafers set stay in the cassette-loading unit 111.

When the pressure of the load lock chamber 121 reaches atmospheric pressure, the device wafers are conveyed to waiting-accommodation unit 113 one wafer at a time along the direction of the arrow A by the conveyer belt unit 112. The waiting-accommodation unit 113 then performs position determination adjustments of the device wafers in the waiting-accommodation unit 113 while the ionizer 114 mounted above the waiting-accommodation unit 113 irradiates a predetermined amount of ions without contacting the device wafers to neutralize charges charged on the surface of the wafer.

Thereafter, the neutralized device wafers are conveyed to the load lock chamber 121. When the entire device wafers are accommodated in the load lock chamber 121, the pressure of the load lock chamber 121 is reduced from atmospheric pressure to a predetermined value, $2\times10^{-5}$ Pa for example. When the pressure reaches the predetermined value, the device wafers are sequentially conveyed from the load lock chamber 121 to the buffer chamber (BUC) 122. The device wafers accommodated in the buffer chamber 122 are cleaned via the cleaning chamber 123. The device wafers are then passed through holders No. 1–No. 4 in the process chamber 13 and passed through the cleaning chamber 123 to be returned to the buffer chamber 122. Predetermined metal thin films are deposited on the surface of the device wafers by sputtering method when the device wafers are passed through holders No. 1–No. 4.

After the formation process of the metal thin films is completed and all of the device wafers are returned to the buffer chamber 122, the device wafers are conveyed to the load lock chamber 121. Thereafter, the pressure in the load lock chamber 121 is increased from vacuum up to atmospheric pressure. When the pressure in the load lock chamber 121 reaches atmospheric pressure, the device wafers are conveyed to waiting-accommodation unit 113 and then returned to the wafer cassette set in the cassette-loading unit 111 by the conveyer belt unit 112 along the direction of arrow B.

This completes the device wafer processing by the sputtering apparatus. Conditions of each process are not described in detail since they are substantially the same as those of usual semiconductor integration circuit manufacturing process.

(b) Second, the flow chart illustrating a particle collection processing shown in FIG. 5(B) will be described.

A large amount of metallic particles are generated from targets during the sputtering process. Generally, the metallic particles tend to have (+) charges in vacuum.

In accordance with the sputtering apparatus, as shown in FIG. 3, an internal plate electrodes 85B and 86B composed of metal plate are mounted along the internal side of side walls 12A and 12B of the pressure buffer unit 12. The internal plate electrodes 85B and 86B are always charged with (−) charges. Therefore, most of the particles 90 floating in the chambers 121, 122 and 123 of the pressure buffer unit 12 are adsorbed to the internal plate electrodes 85B and 86B due to electrostatic force from the internal plate electrodes 85B and 86B imposed on particles 90. As a result, adherence of particles to the device wafers being conveyed along the route A and B are effectively prevented.

On the other hand, the amount of electrical charges of the internal plate electrodes 85B and 86B, i.e. the magnitude of voltage applied between the internal plate electrodes 85B and 86B and the external plate electrodes 85A and 86A is determined depending on the types of processing device and ions.

However, as described above, when surface charge of the device wafer is neutralized using the ionizer 114 in the waiting-accommodation unit 113, the amount of surface charge of the device wafer being conveyed to the pressure buffer unit 12 is almost zero. Therefore, adherence of particles existing in the vacuum container unit 10 to the surface of the device wafers due to electrostatic force are effectively prevented, compared to when the ionizer 114 is not used. The number of particles adhered to the wafer surface in the vacuum container unit 10 can be less than half. In addition, since particles are always collected by the charging means 124 in the pressure buffer unit 12, particles floating in the vacuum container unit 10 (the pressure buffer unit 12) are effectively eliminated. Moreover, neutralization of wafer surface by the ionizer 114 and adsorption of particles by the charging means 124 are performed without any contact to the wafers. Therefore, additional particles are not generated on the wafer surface. As a result, the number of particles floating in the vacuum container unit 10 is maintained at low level and adherence of additional particles from the vacuum container unit 10 to the device wafer is minimized. Therefore, when the allowed numbers of particles per wafer are less than 20 for example, the apparatus can be operated longer than the conventional one. The yield (ratio of source material to product) of the product using the wafer is also improved compared to that in case of using a conventional apparatus.

Since particles in the pressure buffer unit 12 are constantly collected by the charging means, 'device wafer processing' does not require to be stopped for 'particle collection process'. In addition, the ionizer 114 of the waiting-accommodation unit 113 is maintained at neutralization mode for neutralizing surface charge of the device wafers so that the change of mode is not required. As a result, the processing capability (the rate of operation) of the device is substantially improved.

The load lock chamber and the charging means of the apparatus for removing particles will be described in more detail.

Figure 6:
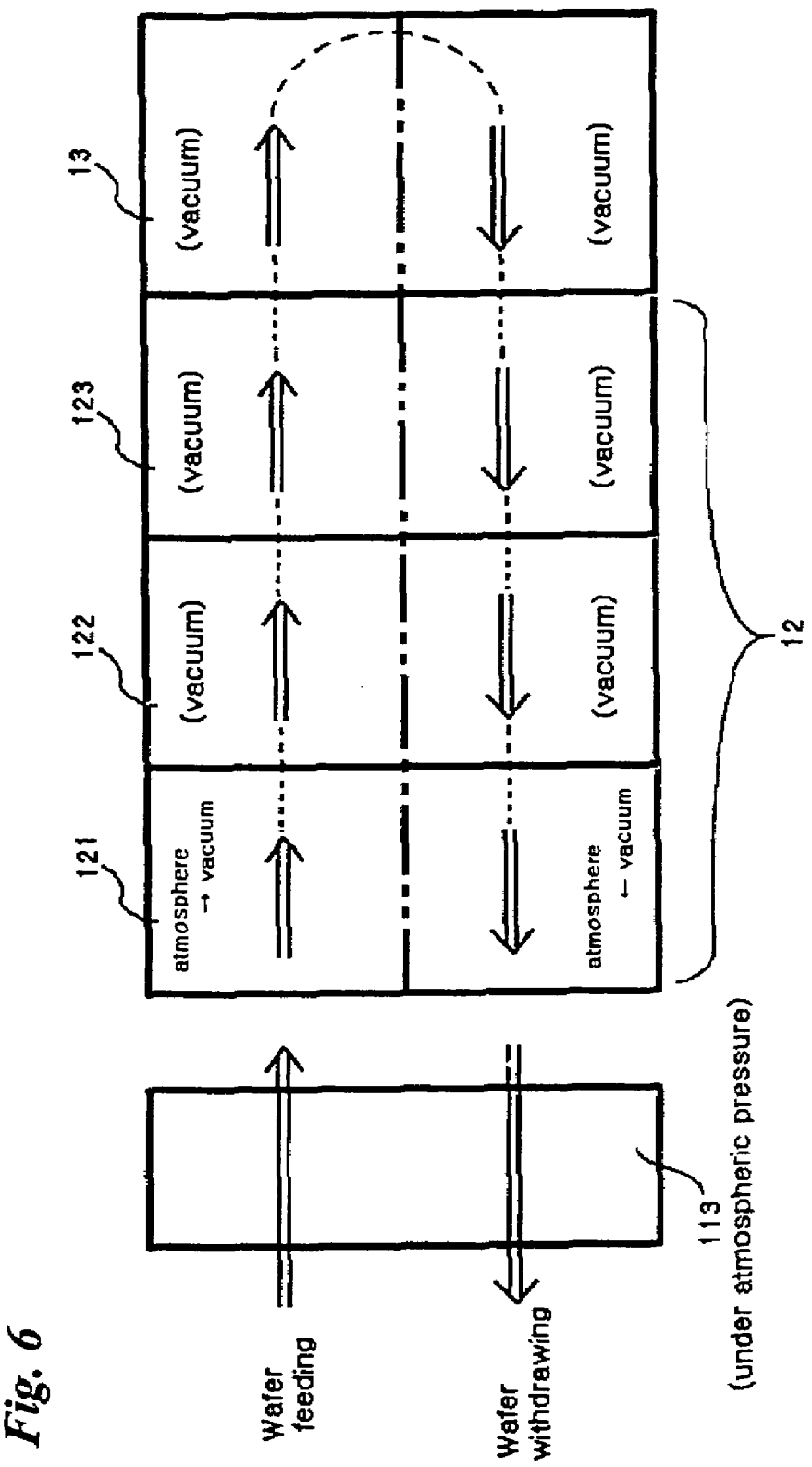
FIG. 6 is a diagram illustrating the pressure state of the chambers through which the wafer is moved.
Figure 7:
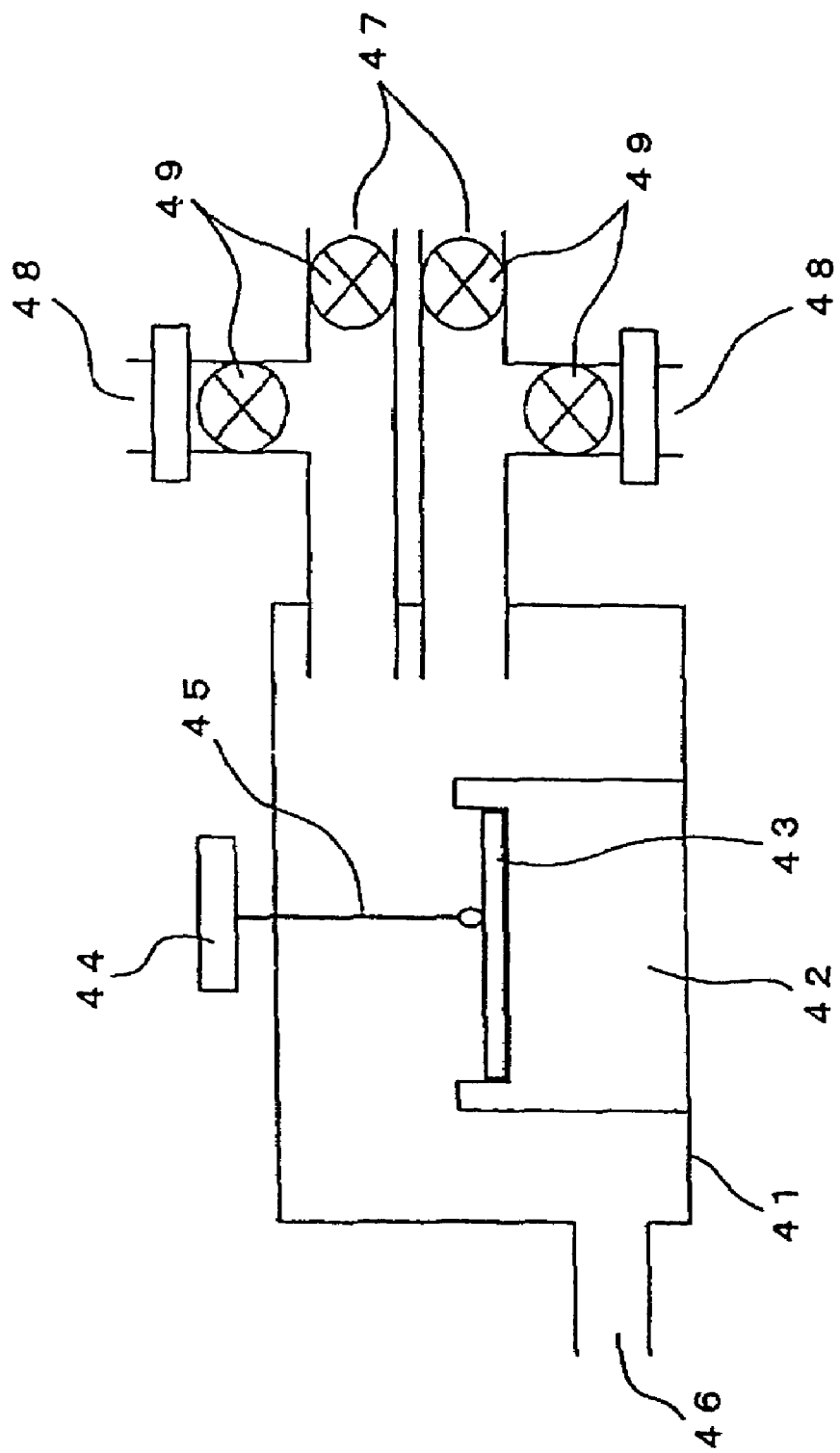
FIG. 7 is a diagram illustrating a method of removing particles in a conventional film-forming device.

FIG. 6 is a diagram illustrating the pressure state of the chambers through which the wafer is moved. As shown in FIG. 6, the load lock chamber 121 serves as a pressure buffer section for feeding the wafer from atmospheric state to vacuum state and withdrawing the wafer from vacuum state to atmospheric state. Referring to FIG. 6, the waiting-accommodation unit 113 is under atmospheric pressure. The waiting-accommodation unit 113 is positioned immediately before the load lock chamber 121 and the ionizer 114 is positioned over the waiting-accommodation unit 113 so that the inonizer normally operates to render the wafer surface always in neutralized state (It corresponds to flow of FIG. 5(A)).

Furthermore, the charging means shown in FIG. 3 are disposed in or on the load lock chamber 121, the buffer chamber 122 and the cleaning chamber 123 which are in the vacuum state, respectively, and are normally collect particles within the vacuum chamber so that a passage of wafer is rendered always in a clean state (It corresponds to flow of FIG. 5(B)).

Namely, in the waiting-accommodation unit 113, the wafer surface is neutralized by the inonizer 114 to be a clean state wherein particles are not adhered due to electrostatic force, etc. Simultaneously, the inside of the vacuum chamber is normally maintained in a clean state by the charging means shown in FIG. 3 and the neutralized clean wafer is passed through the vacuum chamber which is cleaned (double cleaning effect). The flows of FIGS. 5(A) and FIG. 5(B) are proceeded simultaneously.

Special operations are not required for 'particle collection process'. Since wafers for particle collection used in the conventional art are not required, cost for purchasing wafers for particle collection and time and cost for managing the wafers for particle collection can be completely eliminated.

In an example embodiment, the internal plate electrodes 85B and 86B of the charging means 124 are illustrated as one plate (see FIG. 3), respectively. However, the internal plate electrodes 85B and 86B can be divided into multiple segments and the arrangements thereof do not have any restriction as long as they do not contact the device wafers.

The polarity and amount of charges of the internal plate electrodes 85B and 86B of the charging means 124 may be determined depending on characteristics of the particles to be eliminated, etc.

In addition, when the internal plate electrodes 85B and 86B of the charging means 124 are mounted to have multiple segments, the polarities and amounts of charges of respective segments can be set independently or dependently with one another.

Moreover, in the example embodiment, the charging means 124 is mounted in the pressure buffer unit 12 of the vacuum container unit 10. However, the scope of the present invention is not limited to this. The charging means 124 can be mounted in the process chamber 13 instead of the pressure buffer unit 12 or both in the pressure buffer unit 12 and the process chamber 13. The number and arrangement of the charging means 124 does not have any special restriction as long as the charging means 124 does not contact the device wafers.

In the example embodiment, the apparatus for removing particles, which is applied to a sputtering apparatus, has been described. However, the apparatus for removing particles can be applied to other processing device including a vacuum container unit, for example a pressure-reduced CVD apparatus, etching apparatus or ion injection apparatus and provides the same effect. The use of apparatus for removing particles is not restricted to semiconductor integration circuit manufacturing process. The apparatus for removing particles can be applied to processing device including a vacuum container unit used in chemical compound semiconductor manufacturing process and LCD panel manufacturing process, and provides the same effect.

As described above, in accordance with the apparatus for removing particles, the particles in the vacuum container unit can be eliminated effectively without a degrading the rate of operation of the processing device. In addition, the apparatus for removing particles can be embodied simply and inexpensively.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. An apparatus for removing particles for a processing device, the apparatus comprising:
    a vacuum container unit having a plurality of chambers for performing a predetermined process on a wafer;
    a conveyer unit under atmospheric pressure for carrying said wafer to said vacuum container unit;
    wherein said conveyer unit comprises a waiting-accommodation unit;
    a charge neutralizing means for neutralizing charges on a surface of the wafer, the charge neutralizing means being mounted in said waiting-accommodation unit; and
    a charging means for adsorbing particles in the vacuum container unit by electrostatic force, the charging means being mounted in the vacuum container unit.

2. An apparatus according to claim 1, wherein the charge neutralizing means is arranged to neutralize said charges on the surface of the wafer by a discharge from an electrode mounted at a predetermined distance apart from the wafer.

3. An apparatus according to claim 1, wherein the charging means comprises a metal plate mounted apart from the wafer and arranged to adsorb the particles by charging the metal plate.

4. An apparatus according to claim 3, wherein the metal plate comprises internal plate electrodes mounted along the inner side of chamber side walls and external plate electrodes mounted along the outer side of chamber side walls to be opposed to the internal plate electrodes.

5. An apparatus for removing particles for a processing device, the apparatus comprising:
    a vacuum container unit having a plurality of chambers for performing a predetermined process on a wafer;
    a conveyer unit under atmospheric pressure for carrying said wafer to said vacuum container unit;
    wherein said conveyer unit comprises a waiting-accommodation unit;
    a charge neutralizer arranged to neutralize charges on a surface of the wafer, the charge neutralizer being mounted in said waiting-accommodation unit; and
    a charger arranged to adsorb particles in the vacuum container unit by electrostatic force, the charger being mounted in the vacuum container unit.

* * * * *